US012776360B2

(12) United States Patent
Kientz et al.

(10) Patent No.: US 12,776,360 B2
(45) **Date of Patent: *Oct. 27, 2026**

(54) TWO-STAGE VOLTAGE CALIBRATION UPON POWER-UP OF MEMORY DEVICE

(71) Applicant: MICRON TECHNOLOGY, INC., Boise, ID (US)

(72) Inventors: Steven Michael Kientz, Westminster, CO (US); Chia-Yu Kuo, Hukou Town (TW)

(73) Assignee: Micron Technology, Inc., Boise, ID (US)

( * ) Notice: Subject to any disclaimer, the term of this patent is extended or adjusted under 35 U.S.C. 154(b) by 133 days.

This patent is subject to a terminal disclaimer.

(21) Appl. No.: 18/788,532

(22) Filed: Jul. 30, 2024

(65) Prior Publication Data

US 2024/0386936 A1 Nov. 21, 2024

Related U.S. Application Data

(63) Continuation of application No. 17/883,392, filed on Aug. 8, 2022, now Pat. No. 12,073,866.

(Continued)

(51) Int. Cl.
*G11C 29/00* (2006.01)
*G06F 3/06* (2006.01)

(Continued)

(52) U.S. Cl.
CPC ........ *G11C 11/4072* (2013.01); *G06F 3/0604* (2013.01); *G11C 11/4074* (2013.01);

(Continued)

(58) Field of Classification Search
CPC ............ G11C 11/4072; G11C 11/4074; G11C 11/4096; G11C 29/08; G11C 2029/4402;

(Continued)

(56) References Cited

U.S. PATENT DOCUMENTS 9,021,181 B1 * 4/2015 Rotbard ................ G06F 3/0679 711/119
9,558,064 B2 * 1/2017 Parthasarathy ..... G11C 11/5628

(Continued)

*Primary Examiner* — Mushfique Siddique
(74) *Attorney, Agent, or Firm* — Lowenstein Sandler LLP

(57) ABSTRACT

An example method of two-stage voltage calibration upon power-up of a memory device comprises: identifying a set of memory pages that have been programmed within a time window; responsive to detecting a power up event, performing a first calibration operation with respect to the set of memory pages to determine a first value of a data state metric; identifying, among a plurality of voltage offset bins, a first voltage offset bin corresponding to the first value of the data state metric; storing, in a temporary metadata table, a first record associating the set of memory pages with the first voltage offset bin; performing a second calibration operation with respect to the set of memory pages to determine a second value of the data state metric, wherein a second accuracy of the second calibration operation exceeds a first accuracy of the first calibration operation; identifying, among a plurality of voltage offset bins, a second voltage offset bin corresponding to the second value of the data state metric; and storing, in a permanent metadata table, a record associating the set of memory pages with the second voltage offset bin.

20 Claims, 8 Drawing Sheets

Related U.S. Application Data

(60) Provisional application No. 63/312,347, filed on Feb. 21, 2022.

(51) Int. Cl.
*G11C 11/4072* (2006.01)
*G11C 11/4074* (2006.01)
*G11C 11/4096* (2006.01)
*G11C 29/08* (2006.01)
*G11C 29/44* (2006.01)

(52) U.S. Cl.
CPC .......... *G11C 11/4096* (2013.01); *G11C 29/08* (2013.01); *G11C 2029/4402* (2013.01); *G11C 2207/2254* (2013.01)

(58) Field of Classification Search
CPC ........... G11C 2207/2254; G06F 3/0604; G06F 3/0644
See application file for complete search history.

(56) References Cited

U.S. PATENT DOCUMENTS

| | | | | |
|---|---|---|---|---|
| 11,244,732 | B2 * | 2/2022 | Sharon | G06F 11/3058 |
| 11,367,488 | B2 * | 6/2022 | Bhatia | G06F 12/0246 |
| 2013/0132652 | A1 * | 5/2013 | Wood | G11C 29/42<br>711/103 |
| 2019/0043588 | A1 * | 2/2019 | Fisher | G11C 16/26 |
| 2021/0191617 | A1 | 6/2021 | Sheperek et al. | |
| 2023/0266904 | A1 | 8/2023 | Kientz et al. | |

* cited by examiner

TWO-STAGE VOLTAGE CALIBRATION UPON POWER-UP OF MEMORY DEVICE

RELATED APPLICATIONS

This application is a continuation application of U.S. patent application Ser. No. 18/883,392, filed Aug. 8, 2022, which claims the benefit of U.S. Provisional Patent Application No. 63/312,347, filed Feb. 21, 2022, the entirety of which are incorporated herein by reference.

TECHNICAL FIELD

Embodiments of the disclosure relate generally to memory sub-systems, and more specifically, relate to two-stage voltage calibration upon power-up of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
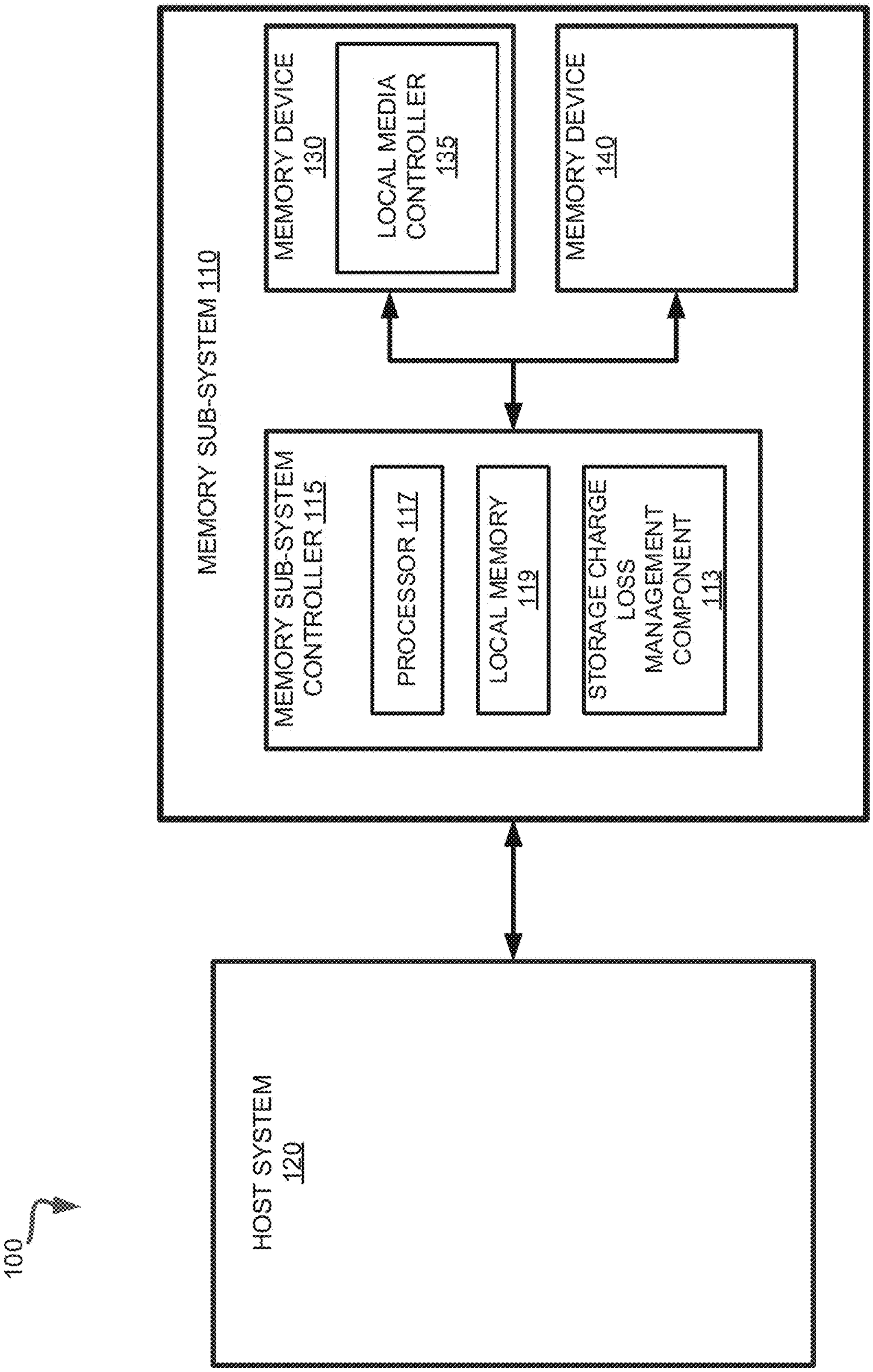
FIG. 1 illustrates an example computing system that includes a memory sub-system in accordance with some embodiments of the present disclosure.

Aspects of the present disclosure are directed to two-stage voltage calibration upon power-up of a memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes, such that each plane carries a matrix of memory cells formed onto a silicon wafer and joined by conductors referred to as wordlines and bitlines, such that a wordline joins multiple memory cells forming a row of the matrix of memory cells, while a bitline joins multiple memory cells forming a column of the matric of memory cells. Depending on the cell type, each memory cell can store one or more bits of binary information, and has various logic states that correlate to the number of bits being stored. The logic states can be represented by binary values, such as "0" and "1", or combinations of such values. A set of memory cells referred to as a memory page can be programmed together in a single operation, e.g., by selecting consecutive bitlines.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss (SCL), the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

Some memory sub-systems mitigate the temporal voltage shift by employing block family-based error avoidance strategies. The temporal voltage shift is selectively tracked for programmed blocks grouped by block families, and appropriate voltage offsets, which are based on block affiliation with a certain block family, are applied to the base read levels in order to perform read operations. "Block family" herein shall refer to a set of blocks that have been programmed within a specified time window and a specified temperature window. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process (also referred to as a calibration scan) in order to evaluate a data state metric (e.g., a bit error rate) and associate each block family with one of predefined threshold voltage offset bins (referred to as bins), which is in turn associated with the voltage offset to be applied for read operations. The bins can be numbered from 0 to 7 (e.g., bin 0-bin 7), and each bin can be associated with a voltage offset to be applied to a base read level for read operations. The associations of block families with bins (e.g., bins 0-7) can be stored in respective metadata tables maintained by the memory sub-system controller. However, once the memory device is disconnected from the power supply (e.g., by a graceful or asynchronous power loss event), the SCL may be significant during the time the memory device is disconnected from the power supply thus most if not all block families will need to be recalibrated using the calibration process. However, the memory sub-system may be unable to precisely determine the duration of the power loss state (e.g., using an internal clock), thus performing the calibration process and maintaining the respective metadata table may not be successful. As a result most if not all of the block families may be improperly associated with the wrong bins.

Some memory sub-systems mitigate the incorrect association of the block families to the bins by performing calibration scans to update the permanent metadata table based on a chosen data state metric. However, a calibration scan after power up can be extremely time consuming because most if not all block families need to be recalibrated. Accordingly, rather than performing calibration scans, a memory sub-system can read a page of each block family with a voltage offset associated with each bin and measure a corresponding value of a chosen data state metric. Then, the memory sub-system associates each block family with the bin whose voltage offset resulted in the lowest value of the data state metric (i.e., a quick calibration procedure). While the quick calibration procedure is much faster than the calibration scan, it may result in assigning certain block families to incorrect bins. For example, a block family may be assigned to a higher bin (e.g., bin 4) rather than a lower bin (e.g., bin 3) which is the correct bin.

Furthermore, a memory sub-system may incorrectly assign block families to the wrong bins, due to only reading a single page of each block family, which can provide a limited comprehension of the data state metrics associated with the overall block family. Additionally, in some embodiments, based on varying widths of the voltage distributions produced by the memory cell, a voltage distribution may be wide enough to support multiple bins that would produce an acceptable data state metric. Accordingly, the bin associated with the data state metric with the lowest value may in fact be applying larger voltage offsets to the base read levels than what is required to compensate for the SCL, thereby adversely affecting the data state metrics. Thus, as the data state metric associated with subsequent read operations exceeds a threshold criterion (e.g., BEC or RBER is above a threshold value) indicating a high error rate associated with the data stored at the block, the memory sub-system performs media management operations (e.g., a folding operation) to relocate the data stored at the wordline or entire block to a new block of the memory sub-system.

Aspects of the present disclosure address the above and other deficiencies by performing two-stage calibration upon the memory sub-system being powered up: the first stage involves a quick synchronization procedure, which reads one or more pages of each block family using threshold voltage offsets of all voltage bins and selects the bin corresponding to the lower value of the error rate. The association of the block family to the selected bin may be stored in a temporary metadata table, which would be utilized for performing subsequent memory access operation until more accurate (and time consuming) calibration operations would be performed and reflected in the permanent metadata table, as described in more detail below.

Advantages of the present disclosure include, but are not limited to, avoiding incorrect assignment of block families to bins in the permanent metadata table, thus improving performance of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fiber Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells, such as memory array 137. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controller 132 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 132) for media management within the same memory device package. An example of a managed memory device is a managed NAND (MNAND) device.

In one embodiment, the memory sub-system 110 includes a storage charge loss management (SCLM) component 113 that maintains a temporary metadata table. Upon detecting a power up event is, the SCLM component 113 performs, for each block family, a quick calibration scan and stores, in the temporary metadata table, a record associating the block family with a voltage offset bin determined by the quick calibration scan. In some embodiments, the SCLM component 113 performs the quick calibration scan by performing multiple read operations on one or more pages of the block family using voltage offsets associated with each bin of the plurality of bins. The SCLM component 113 then identifies the read operation that has produced the lowest data state metric and stores, in the temporary metadata table, a record associating the block family the voltage offset bin that was utilized by the read operation producing the lowest data state metric. In some embodiments, either subsequent to the quick calibration scan and/or simultaneously with the quick calibration scan, the SCLM component 113 initiates a regular calibration process, which evaluates a data state metric for associating each block family with one of plurality of voltage offset bins. The results or the regular calibration scan are stored in the permanent metadata table.

The regular calibration process is more accurate in determining the voltage offset bin of the plurality of voltage offset bins that will produce the least amount of bit error rates over time. The quick calibration process, which is less accurate than the calibration process, may develop a larger amount of bit error rates as compared to the calibration process over time. The quick calibration process is sufficient for providing a voltage offset bin that the SCLM component 113 can use to perform read operations until the permeant metadata table is fully updated. Accordingly, the associations of the block families and the voltage offset bins as a result of the quick calibration are stored in the temporary metadata table for access by the SCLM component 113. Upon receiving a request to perform a read operation on a block family, the SCLM component 113 may determine, based on a bit flag indicating the state of at least a portion of the permeant metadata table, whether to obtain a voltage offset of a voltage offset bin associated with the block family from the permanent metadata table or the temporary metadata table. In some embodiments, the bit flag may be set to logical "1" to indicate that the permanent metadata table has been updated and the voltage offset of the voltage offset bin associated with the block family can be obtained from the permanent metadata table. Conversely, the bit flag may be reset to logical "0" to indicate that the permanent metadata table is not updated and the voltage offset of the voltage offset bin associated with the block family should be obtained from the temporary metadata table. In one embodiment, the SCLM management component 113 may set the bit flag in response to determining that the calibration scan has been performed on all block families and reset the bit flag in response to determining that the memory device 130 and/or 140 experienced a power loss event and the permanent metadata table has not been updated since the power up event. In another embodiment, multiple bit flags may be employed, each bit flag indicating the state of a corresponding portion of the permanent metadata table (e.g., for one or more block families).

Once a voltage offset is obtained from a metadata table, the SCLM component 113 performs the read operation on the block family by applying the voltage offset to base read level voltage. Further details regarding the operations of the SCLM component 113 are described below.

Figure 2:
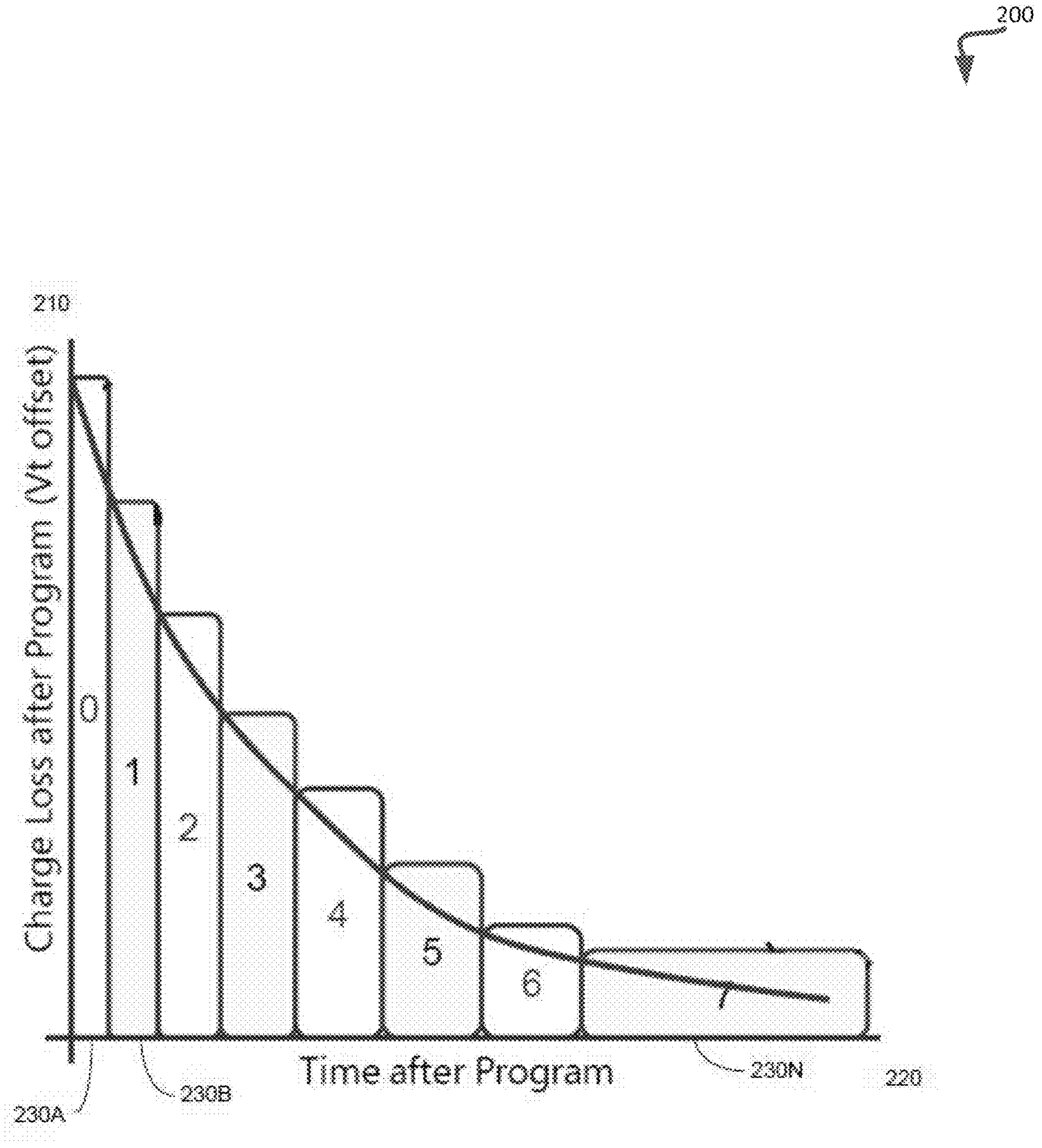
FIG. 2 depicts an example graph illustrating the dependency of the threshold voltage offset on the time after program (i.e., the period of time elapsed since the block had been programmed, in accordance with some embodiments of the present disclosure.

FIG. 2 depicts an example graph 200 illustrating the dependency of the threshold voltage offset 210 on the time after program 220 (i.e., the period of time elapsed since the block had been programmed. As schematically illustrated by FIG. 2, blocks of the memory device are grouped into block families 230A-230N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family 210 are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin 0. Then, the memory sub-system controller can periodically perform a calibration process in order to associate each die of every block family with one of the predefines threshold voltage offset bins (bins 0-7 in the illustrative example of FIG. 2), which is in turn associated with the voltage offset to be applied for read operations. The associations of blocks with block families and block families and dies with threshold voltage offset bins can be stored in respective metadata tables maintained by the memory sub-system controller.

Figure 3:
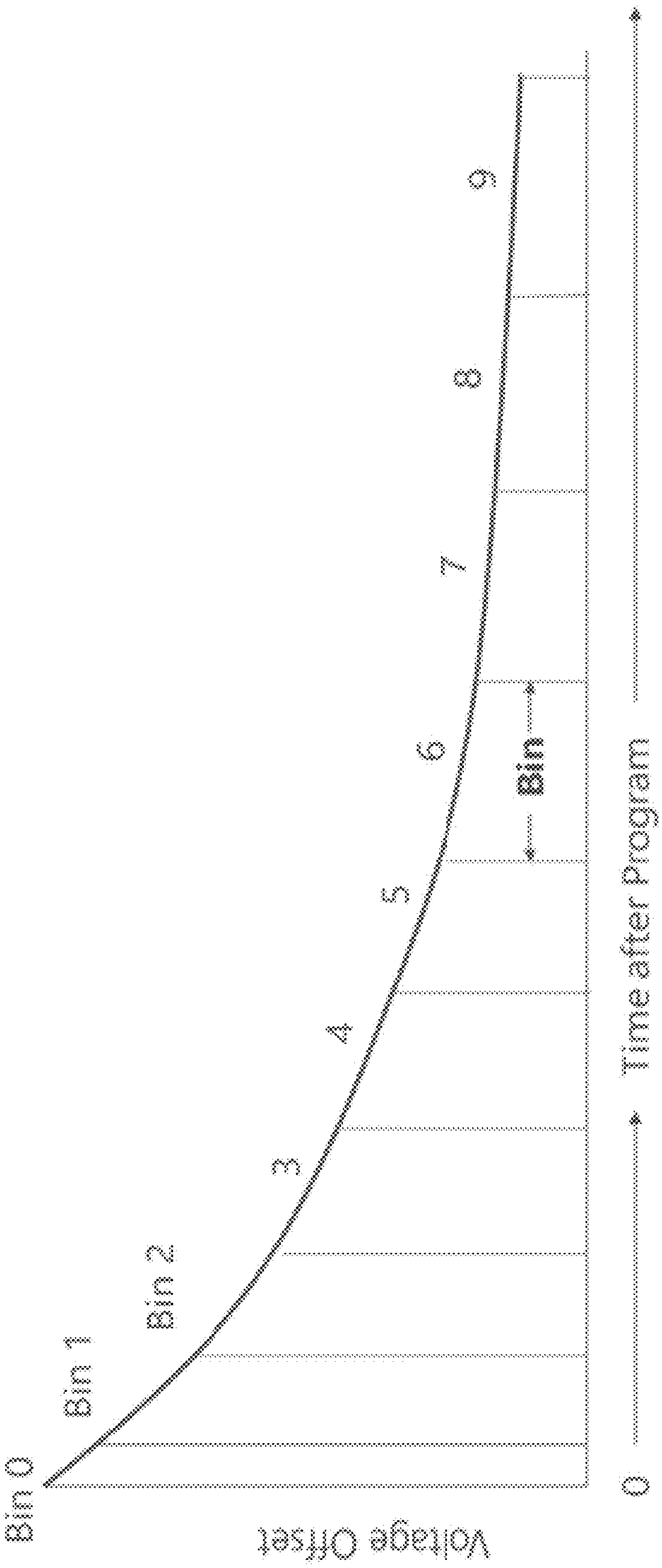
FIG. 3 schematically illustrates a set of predefined threshold voltage offset bins, in accordance with embodiments of the present disclosure.

FIG. 3 schematically illustrates a set of predefined threshold voltage offset bins (bin 0 to bin 9), in accordance with embodiments of the present disclosure. As schematically illustrated by FIG. 3, the threshold voltage offset graph can be subdivided into multiple threshold voltage offset bins, such that each bin corresponds to a predetermined range of threshold voltage offsets. While the illustrative example of FIG. 4 defines ten bins, in other implementations, various other numbers of bins can be employed (e.g., 64 bins). Based on a periodically performed calibration process, the memory sub-system controller associates each die of every block family with a threshold voltage offset bin, which defines a set of threshold voltage offsets to be applied to the base voltage read level in order to perform read operations, as described in more detail herein below.

Figure 4:
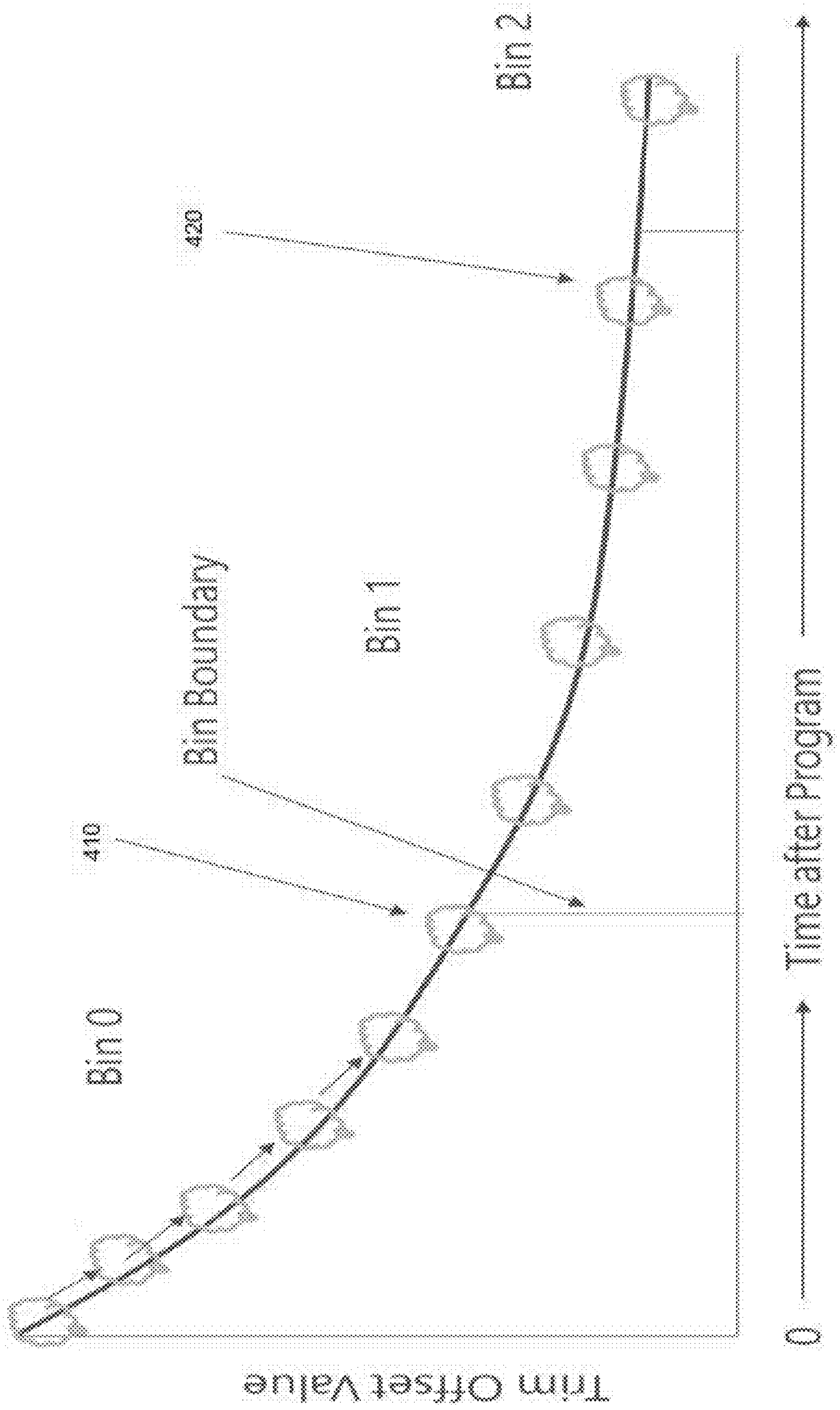
FIG. 4 schematically illustrates selecting block families for calibration, in accordance with embodiments of the present disclosure.

FIG. 4 schematically illustrates selecting block families for calibration, in accordance with embodiments of the present disclosure. As schematically illustrated by FIG. 4, the memory sub-system controller can limit the calibration operations to the oldest block family in each bin (e.g., block family 410 in bin 0 and block family 420 in bin 1), since it is the oldest block family that will, due to the slow charge loss, migrate to the next bin before any other block family of the current bin.

Figure 5:
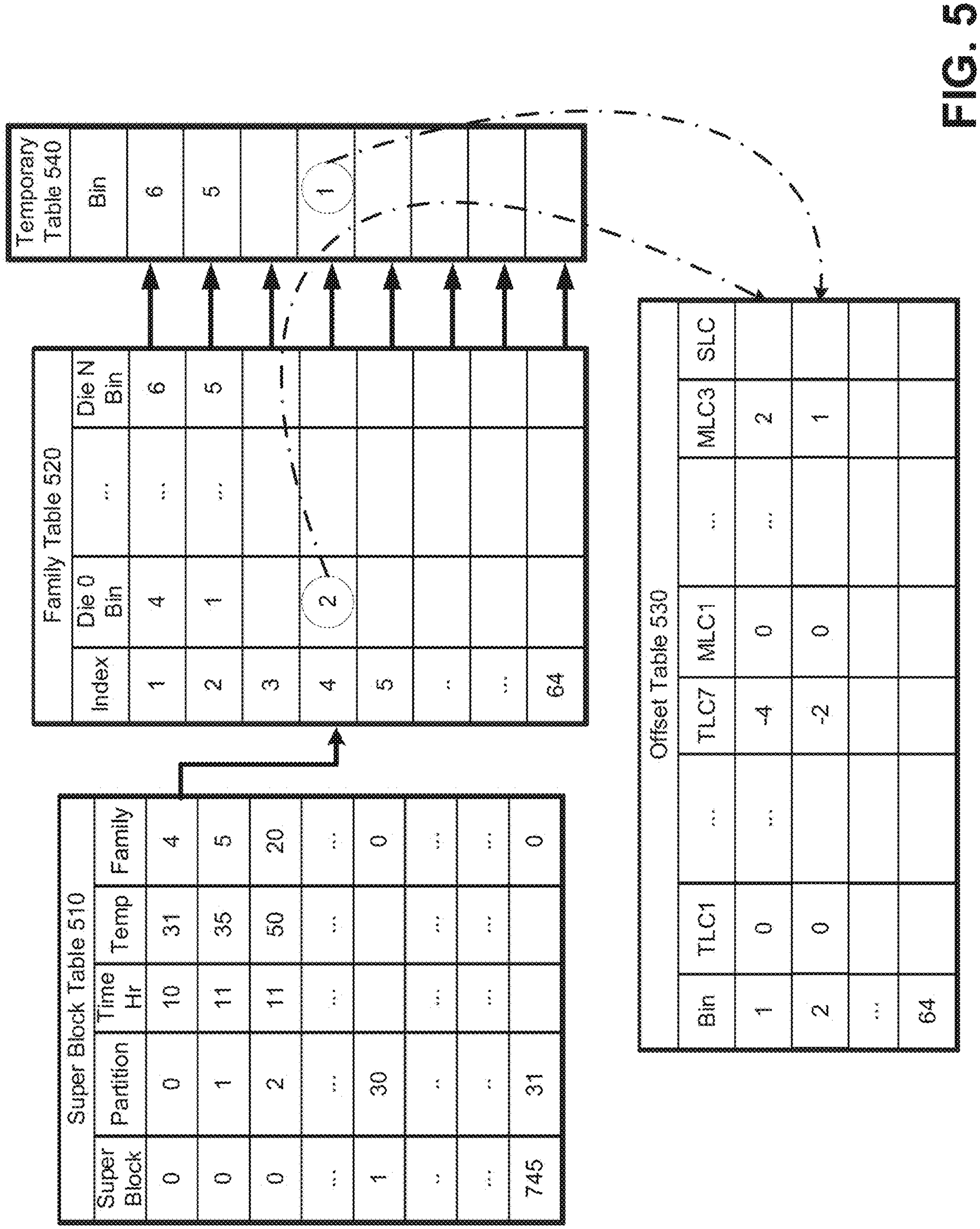
FIG. 5 schematically illustrates example tables maintained by a memory sub-system controller for two-stage voltage calibration upon power-up of a memory device in accordance with some embodiments of the present disclosure.

FIG. 5 schematically illustrates example metadata tables maintained by the memory sub-system controller for two-stage voltage calibration upon power-up of a memory device, in accordance with embodiments of the present disclosure. As schematically illustrated by FIG. 5, the memory sub-system controller can maintain the superblock table 510, the block family table 520, the offset table 530, and the temporary metadata table 540.

Each record of the superblock table 510 specifies the block family associated with the specified superblock and partition combination. In some implementations, the superblock table records can further include time and temperature values associated with the specified superblock and partition combination.

The block family table 520 (also referred to as "permeant metadata table" herein) is indexed by the block family number, such that each record of the block family table 520 specifies, for the block family referenced by the index of the record, a set of threshold voltage offset bins associated with respective dies of the block family. In other words, each record of the block family table 520 includes a vector, each element of which specifies the threshold voltage offset bin associated with the die referenced by the index of the vector element. The threshold voltage offset bins to be associated with the block family dies can be determined by the calibration process, as described in more detail herein above.

The offset table 530 is indexed by the bin number. Each record of the offset table 530 specifies a set of threshold voltage offsets (e.g., for TLC, MLC, and/or SLC) associated with threshold voltage offset bin.

The temporary metadata table 540 includes a plurality of records corresponding to the plurality of records of the block family table 520, for example, a first record of the temporary metadata table 540 corresponds to a first record of the block family table 520 and so on. Thus, a record of the temporary metadata table 540 specifies, for the block family referenced by the corresponding record of the block family table 520, a threshold voltage offset bin associated with the block family by the quick calibration scan. In some embodiments, the temporary metadata table 540 may be indexed by the block family number.

The permanent metadata tables 510-540 can be stored on one or more memory devices 130 of FIG. 1. In some implementations, at least part of the permanent metadata tables can be cached in the local memory 119 of the memory sub-system controller 115 of FIG. 1.

In operation, upon receiving a read command, the memory sub-system controller determines (e.g., by inspecting one or more bit flags, each flag indicating the update state of at least a portion of the block family table) whether the block family table 520 has been updated after the latest power up event. Thus, based on the bit flag, the memory sub-system controller determines whether to process the read command using the voltage offset bins specified by the block family table (if the block family table has been updated) or the temporary metadata table (if the permanent metadata table has not yet been updated).

Responsive to receiving a read command, the memory sub-system controller determines the physical address corresponding to the logical block address (LBA) specified by the read command. Components of the physical address, such as the physical block number and the die identifier, are utilized for performing the permanent metadata table walk: first, the superblock table 510 is used to identify the block family identifier corresponding to the physical block number; then, the block family identifier is used as the index to the block family table 520 or the temporary metadata table 540 in order to determine the threshold voltage offset bin associated with the block family and the die; finally, the identified threshold voltage offset bin is used as the index to the offset table 530 in order to determine the threshold voltage offset corresponding to the bin. The memory sub-system controller can then additively apply the identified threshold voltage offset to the base voltage read level in order to perform the requested read operation.

In the illustrative example of FIG. 5, the superblock table 510 maps partition 0 of the superblock 0 to block family 4, which is utilized as the index to the block family table 520 in order to determine that die 0 is mapped to bin 3. The latter value is used as the index to the offset table in order to determine the threshold voltage offset values for bin 3.

Figure 6:
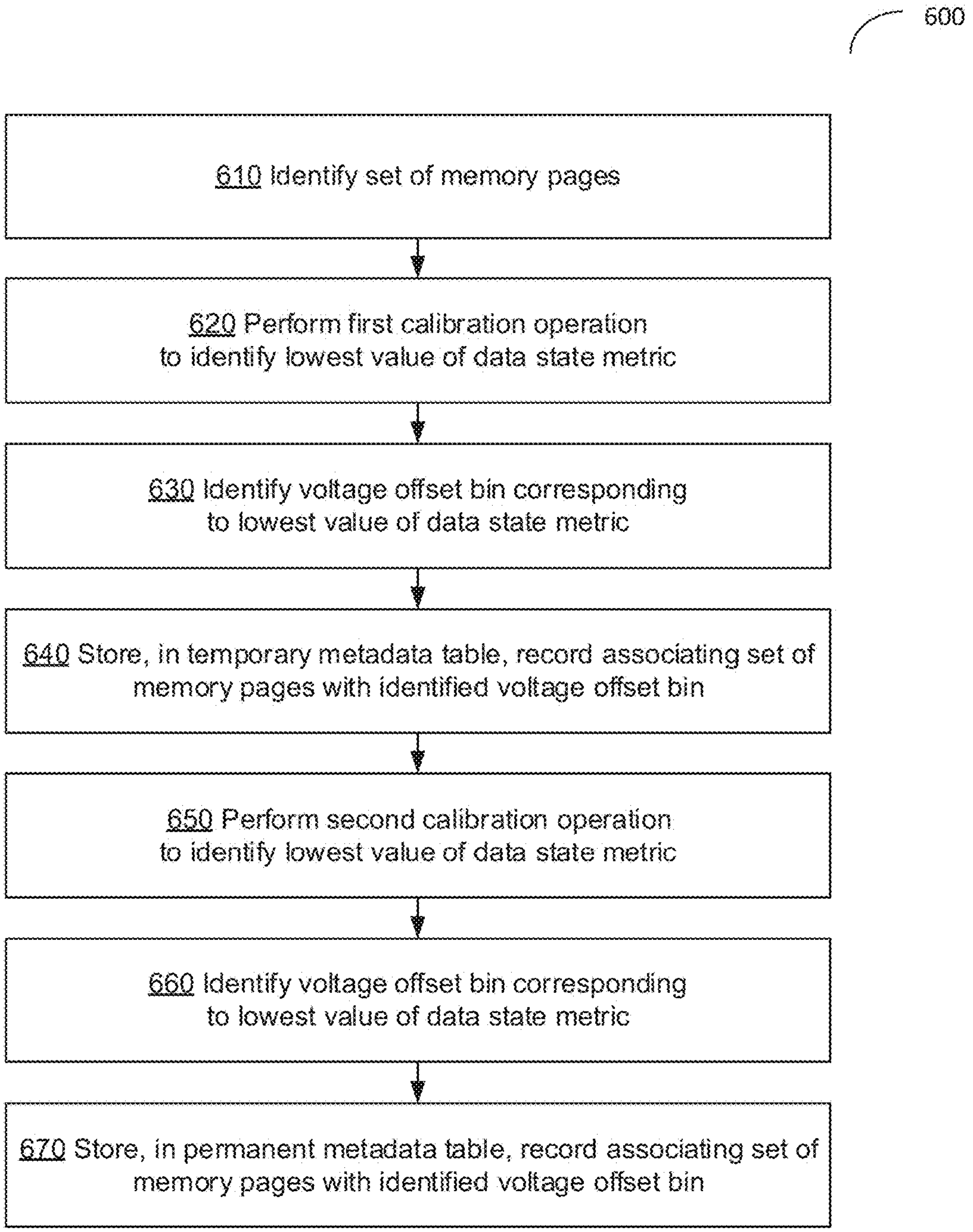
FIG. 6 is a flow diagram of an example method of two-stage voltage calibration upon power-up of a memory device in accordance with some embodiments of the present disclosure.

FIG. 6 is a flow diagram of an example method 600 of calibrating threshold voltage offset bins at memory device power-up in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by SCLM component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic identifies (e.g., using block family metadata), a set of memory pages that have been programmed within a certain time window. In some embodiments, the set of memory pages is a block family.

At operation 620, responsive to detecting a power up event, the processing logic performs a first calibration operation (i.e., the quick calibration scan) with respect to the set of memory pages. Performing the first calibration operation may involve traversing the set of voltage offset bins, such that for each voltage offset bin, the processing logic can perform, with respect to one or more memory pages of the set of memory pages, a read operation using the voltage offset specified by the voltage offset bin. For each read operation, a corresponding data state metric (e.g., the raw bit error rate (RBER) is determined), and the lowest value of the data state metric is identified among all data state metric values produced by the read operations.

At operation 630, the processing logic identifies the voltage offset bin corresponding to the identified lowest value of the data state metric produced by the first calibration operation (i.e., the voltage offset bin that has been utilized by the read operation resulting in the lowest value of the data state metric).

At operation 640, the processing logic stores, in the temporary metadata table, a record associating the set of memory pages with the identified voltage offset bin.

At operation 650, the processing logic performs a second calibration operation (i.e., the regular calibration scan) with respect to the set of memory pages. Performing second first calibration operation may involve traversing the set of voltage offset bins, such that for each voltage offset bin, the processing logic can perform, with respect to one or more memory pages of the set of memory pages, a read operation using the voltage offset specified by the voltage offset bin. For each read operation, a corresponding data state metric (e.g., the raw bit error rate (RBER) is determined), and the lowest value of the data state metric is identified among all data state metric values produced by the read operations As described previously, the second calibration operation (regular calibration scan) is more accurate than the first calibration operation (quick calibration scan). In some implementations, the subset of pages utilized by the second calibration operation may include more pages than the subset of pages utilized by the first calibration operation.

At operation 660, the processing logic identifies the voltage offset bin corresponding to the identified lowest value of the data state metric produced by the second calibration operation (i.e., the voltage offset bin that has been utilized by the read operation resulting in the lowest value of the data state metric).

At operation 670, the processing logic stores, in the permanent metadata table (e.g., the block family table), a record associating the set of memory pages with the identified voltage offset bin.

In some embodiments, the second calibration operation is performed periodically to maintain the association of block families with the second voltage offset bins.

Figure 7:
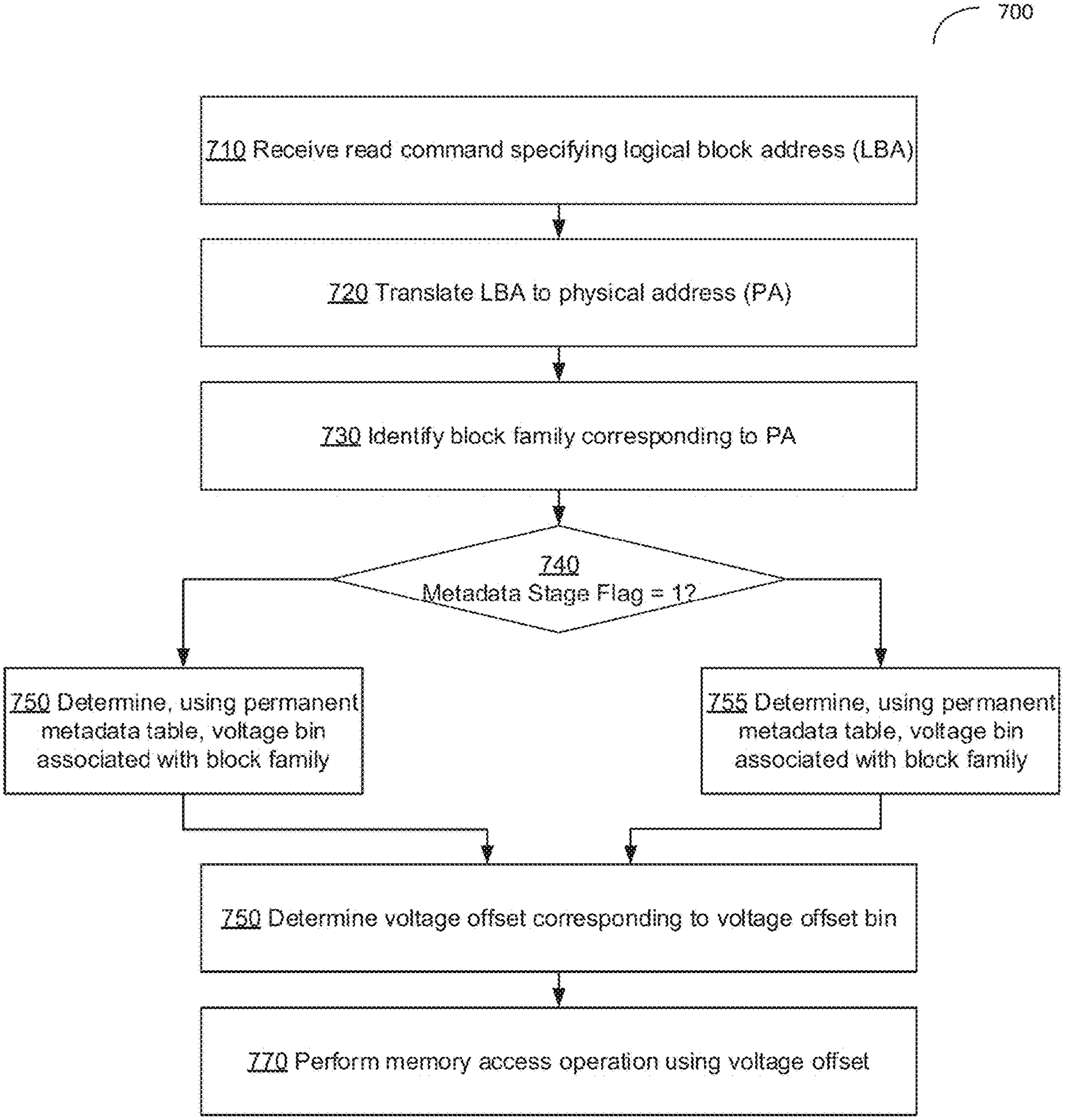
FIG. 7 is a flow diagram of an example method of performing a memory access operation in accordance with some embodiments of the present disclosure.

FIG. 7 is a flow diagram of an example method 700 of performing a memory access operation in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by SCLM component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic receives a read command specifying a logical block address (LBA).

At operation 720, the processing logic translates the LBA to a physical address, which includes the physical block number and the die identifier corresponding to the LBA.

At operation 730, the processing logic identifies the block family corresponding to the physical address (e.g., using the superblock table 510 of FIG. 5).

At operation 740, the processing logic inspects the bit flag indicating the state of the permanent metadata table (e.g., the block family table). Responsive to determining, at operation 740, that the bit flag is set to a first logical value (e.g., logical "1"), the processing continues at block 750; otherwise, if the bit flag is set to a second logical value (e.g., logical "0"), the method branches to block 755.

At block 750, the processing logic utilizes the block family identifier produced by operation 730 as the index to the permanent metadata table (e.g., block family table 520 of FIG. 5) in order to determine the threshold voltage offset bin associated with the block family.

Alternatively, at block 755, the processing logic utilizes the block family identifier produced by operation 730 as the index to the temporary metadata table (e.g., temporary metadata table 540 of FIG. 5) in order to determine the threshold voltage offset bin associated with the block family.

At block 760, the processing device uses the identified threshold voltage offset bin to index the voltage offset table (e.g., table 530 of FIG. 5) in order to determine the voltage offset corresponding to the identified bin.

At block 770, the processing device additively applies the identified voltage offset to the base voltage read level in order to perform the requested read operation, and the method terminates.

Figure 8:
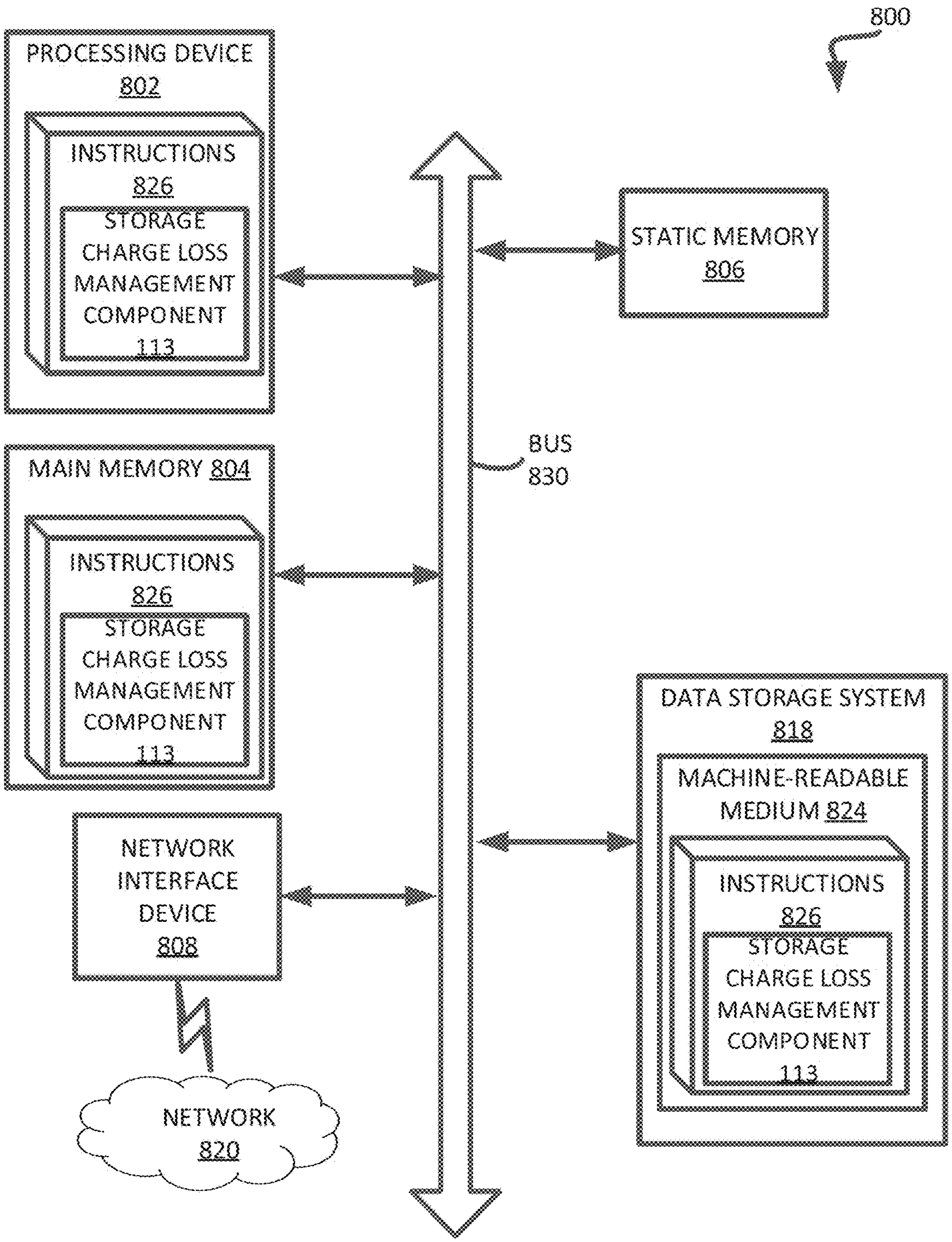
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the SCLM component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to SCLM component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

responsive to detecting a power up event associated with a memory device, performing, for each block family of a plurality of block families of the memory device, a first calibration operation to obtain a first voltage offset bin for a respective block family, wherein the first voltage offset bin has been used for page access operations that resulted in a lowest first value of a data state metric;

storing, in a record of a temporary metadata table, the first voltage offset bin for each block family of the plurality of block families;

performing, for each block family of the plurality of block families, a second calibration operation with respect to the respective block family to obtain a second voltage offset bin for a respective block family, wherein a second accuracy of the second calibration operation exceeds a first accuracy of the first calibration operation; and storing, in a record of a permanent metadata table, the second voltage offset bin for each block family of the plurality of block families.

2. The method of claim 1, wherein the respective block family comprises a set of memory pages.

3. The method of claim 1, wherein performing the first calibration operation further comprises:

performing a memory access operation on a memory page of the respective block family, wherein the memory access operation utilizes a voltage offset associated with the first voltage offset bin; and selecting, among a plurality of voltage offset bins, a voltage offset bin that is associated with the lowest first value of the data state metric.

4. The method of claim 1, wherein performing the second calibration operation further comprises:

performing a memory access operation on a memory page of the respective block family, wherein the memory access operation utilizes a voltage offset associated with the second voltage offset bin; and selecting, among a plurality of voltage offset bins, a voltage offset bin that is associated with a lowest second value of the data state metric.

5. The method of claim 1, further comprising:

responsive to determining that a bit flag indicating an updated state of at least a portion of the permanent metadata table is set to a first logical state, utilizing the temporary metadata table for performing a memory access operation.

6. The method of claim 1, further comprising:

responsive to determining that a bit flag indicating an updated state of at least a portion of the permanent metadata table is set to a second logical state, utilizing the permanent metadata table for performing a memory access operation.

7. The method of claim 1, detecting the power up event further comprising determining that the power up event is subsequent to an asynchronous power loss event.

8. A system comprising:

a memory device; and a processing device coupled to the memory device, the processing device to perform operations comprising:

responsive to detecting a power up event associated with a memory device, performing, for each block family of a plurality of block families of the memory device, a first calibration operation to obtain a first voltage offset bin for a respective block family, wherein the first voltage offset bin has been used for page access operations that resulted in a lowest first value of a data state metric;

storing, in a record of a temporary metadata table, the first voltage offset bin for each block family of the plurality of block families;

performing, for each block family of the plurality of block families, a second calibration operation with respect to the respective block families to obtain a second voltage offset bin for a respective block family, wherein a second accuracy of the second calibration operation exceeds a first accuracy of the first calibration operation; and storing, in a record of a permanent metadata table, the second voltage offset bin for each block family of the plurality of block families.

9. The system of claim 8, wherein the respective block family comprises a set of memory pages.

10. The system of claim 8, wherein performing the first calibration operation further comprises:

performing a memory access operation on a memory page of the respective block family, wherein the memory access operation utilizes a voltage offset associated with the first voltage offset bin; and selecting, among a plurality of voltage offset bins, a voltage offset bin that is associated with the lowest first value of the data state metric.

11. The system of claim 8, wherein performing the second calibration operation further comprises:

performing a memory access operation on a memory page of the respective block family, wherein the memory access operation utilizes a voltage offset associated with the second voltage offset bin; and selecting, among a plurality of voltage offset bins, a voltage offset bin that is associated with a lowest second value of the data state metric.

12. The system of claim 8, wherein the operations further comprise:

responsive to determining that a bit flag indicating an updated state of at least a portion of the permanent metadata table is set to a first logical state, utilizing the temporary metadata table for performing a memory access operation.

13. The system of claim 8, wherein the operations further comprise:

responsive to determining that a bit flag indicating an updated state of at least a portion of the permanent metadata table is set to a second logical state, utilizing the permanent metadata table for performing a memory access operation.

14. The system of claim 8, detecting the power up event further comprising determining that the power up event is subsequent to an asynchronous power loss event.

15. A non-transitory computer-readable storage medium comprising instructions that, when executed by a processing device, cause the processing device to perform operations comprising:

responsive to detecting a power up event associated with a memory device, performing, for each block family of a plurality of block families of the memory device, a first calibration operation to obtain a first voltage offset bin for a respective block family, wherein the first voltage offset bin has been used for page access operations that resulted in a lowest first value of a data state metric;

storing, in a record of a temporary metadata table, the first voltage offset bin for each block family of the plurality of block families;

performing, for each block family of the plurality of block families, a second calibration operation with respect to the respective block families to obtain a second voltage offset bin for a respective block family, wherein a second accuracy of the second calibration operation exceeds a first accuracy of the first calibration operation; and storing, in a record of a permanent metadata table, the second voltage offset bin for each block family of the plurality of block families.

16. The non-transitory computer-readable storage medium of claim 15, wherein the respective block family comprises a set of memory pages.

17. The non-transitory computer-readable storage medium of claim 15, wherein performing the first calibration operation further comprises:

performing a memory access operation on a memory page of the respective block family, wherein the memory access operation utilizes a voltage offset associated with the first voltage offset bin; and selecting, among a plurality of voltage offset bins, a voltage offset bin that is associated with the lowest first value of a data state metric.

18. The non-transitory computer-readable storage medium of claim 15, wherein performing the second calibration operation further comprises:

performing a memory access operation on a memory page of the respective block family, wherein the memory access operation utilizes a voltage offset associated with the second voltage offset bin; and selecting, among a plurality of voltage offset bins, a voltage offset bin that is associated with a lowest second value of the data state metric.

19. The non-transitory computer-readable storage medium of claim 15, wherein the operations further comprise:

responsive to determining that a bit flag indicating an updated state of at least a portion of the permanent metadata table is set to a first logical state, utilizing the temporary metadata table for performing a memory access operation.

20. The non-transitory computer-readable storage medium of claim 15, wherein the operations further comprise:

responsive to determining that a bit flag indicating an updated state of at least a portion of the permanent metadata table is set to a second logical state, utilizing the permanent metadata table for performing a memory access operation.

* * * * *